United States Patent
Yang et al.

(10) Patent No.: US 6,944,437 B2
(45) Date of Patent: Sep. 13, 2005

(54) ELECTRONICALLY PROGRAMMABLE MULTIMODE CIRCUIT

(75) Inventors: Jeffrey Ming-Jer Yang, Cerritos, CA (US); Matt Nishimoto, Torrance, CA (US); Xing Lan, La Palma, CA (US); Michael Battung, Torrance, CA (US); Robert Wang, Torrance, CA (US); Yun-Ho Chung, Redondo Beach, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 61 days.

(21) Appl. No.: 10/705,252

(22) Filed: Nov. 10, 2003

(65) Prior Publication Data
US 2005/0099222 A1 May 12, 2005

(51) Int. Cl.[7] .................................................. H04B 1/30
(52) U.S. Cl. ........................ 455/323; 455/333; 455/334; 455/289; 455/249.1; 455/110; 327/254; 327/117
(58) Field of Search ................................. 455/323, 333, 455/334, 341, 289, 280, 293, 232.1, 249.1, 102, 108, 110; 327/237, 238, 254, 2, 102, 116, 117

(56) References Cited

U.S. PATENT DOCUMENTS

| | | | | |
|---|---|---|---|---|
| 4,080,573 A | * | 3/1978 | Howell | 455/318 |
| 4,638,190 A | | 1/1987 | Hwang et al. | |
| 5,784,687 A | * | 7/1998 | Itoh et al. | 455/78 |
| 2005/0070325 A1 | * | 3/2005 | Bellaouar et al. | 455/550.1 |

OTHER PUBLICATIONS

Marcel Kossel; A Dualgate FET Modulator for an RFID Application in the 2.4 GHz ISM Band; Swiss Federal Institute of Tech. (ETH) Zurich; Zurich, Switzerland; 4 pages.

* cited by examiner

*Primary Examiner*—Nguyen T. Vo
*Assistant Examiner*—Blane J. Jackson
(74) *Attorney, Agent, or Firm*—LaRiviere, Grubman & Payne, LLP

(57) ABSTRACT

An electronically programmable multimode circuit is described. More particularly, the present invention is an electronically programmable multimode circuit that includes a first path and a second path wherein a mode and a signal directional flow direction is controlled through the selective biasing of the first path and the second path. A multimode circuit is produced that contains modes such as a phase shifter mode, an IQ modulation mode, an amplifier mode, a mixer mode, and a multiplier mode.

19 Claims, 10 Drawing Sheets

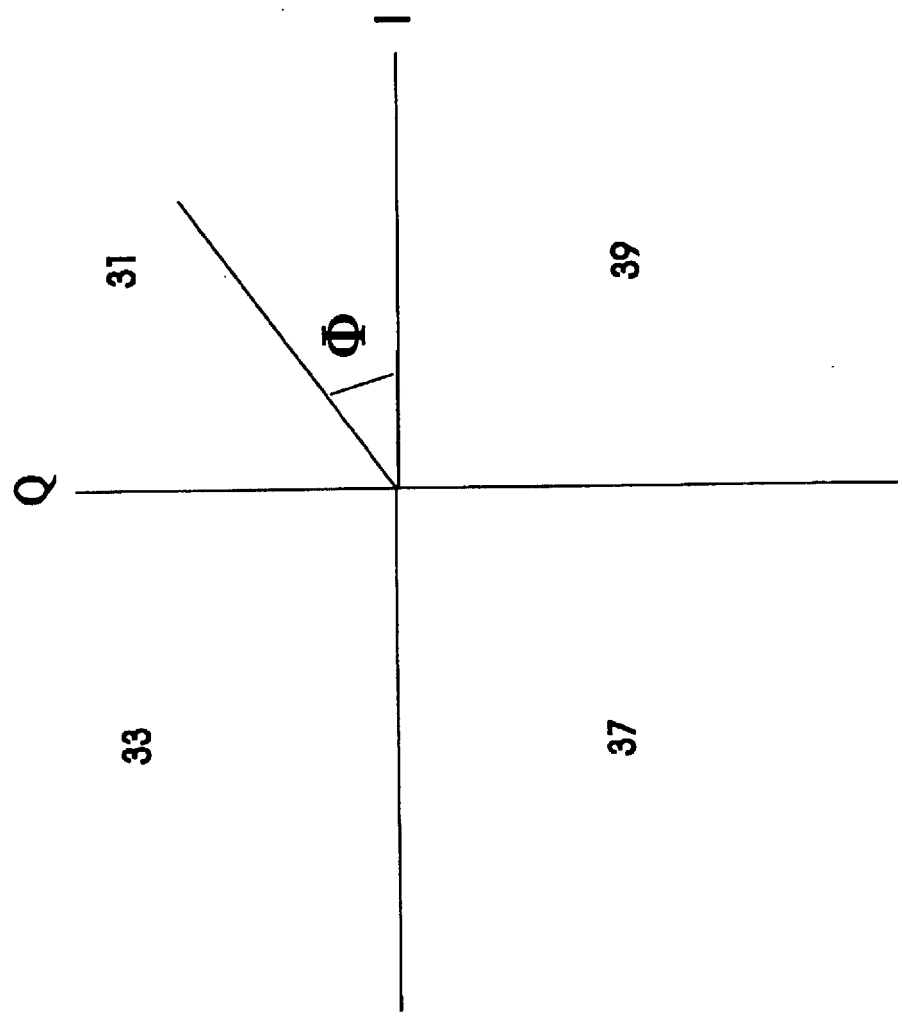

ELECTRONICALLY PROGRAMMABLE MULTIMODE CIRCUIT

FIELD OF THE INVENTION

The present invention relates to an electronically programmable, multimode circuit for electronic systems. More particularly, the present invention relates to an electronically programmable, multimode Monolithic Microwave Integrated Circuit (MMIC) that allows a user to electronically program and to reprogram the electronic hardware components so that the same multimode circuit may be utilized for multiple receive and transmit applications. For instance, the multimode circuit may be programmed for at least one mode selected from a group consisting of a phase shifter mode, an In-Phase and Quadrature (IQ) modulator mode, an amplifier mode, an attenuator mode, a multiplier mode, and a mixer mode. Multiple electronically programmable, multimode circuits may be cascaded to achieve a user desired electronic system functionality.

DESCRIPTION OF THE PRIOR ART

Electronic systems require electronic hardware to perform processing on an electronic signal, which processing includes amplification, multiplication, mixing, attenuation, phase shifting, and In-Phase and Quadrature (IQ) modulation. Some examples of electronic systems include radar systems that require electronic hardware for target acquisition and tracking and communication systems that require electronic hardware to transmit and to receive signals to and from a multiplicity of users.

For radar and communication systems applications, electronic hardware is typically coupled to at least one antenna to receive and to transmit signals. For receiver applications, the antenna spatially scans for signals by steering the antenna radiation beam pattern, and locks onto a desired signal. An antenna comprising an amplitude excited and/or phase excited array may be used to forming receive beams to search for an incoming signal. The amplitude and/or phase excited array may also shape transceiver beams to provide a high signal strength in the direction of a client. One example of such an array antenna is a phased array.

The phased array includes a plurality of spaced apart radiating elements. Each of the radiating elements may be independently controlled to radiate electromagnetic energy in a desired direction and to form a desired beam shape. Each of the radiating elements are provided signals having a selected phase and an amplitude excitation relative to one another for signal transmission, and receives signals from each element are processed to modify the phase and amplitude of each signal for signal reception. The amplitude excitation of the radiating elements may be used to control the beam shape and the side lobe level. One method to control the beam shape and the side lobe level is to utilize electronic hardware such as a transceiver circuit for each radiating element, i.e., a circuit containing both transmitter and receiver signal capability.

A transceiver module will normally include multiple types of electronic hardware components. For receiver applications, a received signal is amplified by a low noise amplifier, converted by a microwave mixer into a baseband frequency signal, and amplified by a baseband amplifier. For transmitter applications, a transmitted signal is amplified by a high power amplifier before being transmitted by an antenna. However, prior art transceiver modules for receiver and transmitter applications have a fixed circuit topology. A fixed topology is problematic if modified system requirements require disassembly of a transceiver module to modify or to replace electronic hardware components.

Prior art, such as U.S. Pat. No. 4,638,190, addresses the need for digitally controlling the phase shift of an input signal. Prior art, such as technical publication "A Dualgate FET modulator for a RFID application in the 2.4 GHz ISM band" by author Marcel Kossel, describes an active modulator using 0.6 um dualgate Field Effect Transistors (FETS). However, the prior art does not address the situation when modified system requirements require the removal or the addition of electronic hardware components from an existing electronic system. For example, receiver applications could require modified system requirements including an additional phase shift block or a multiplication block, and for transmitter applications, the addition of IQ modulation components or a mixer block. Additionally, system requirements may make it necessary to change the transceiver module gain or phase to change the signal pattern for the transmitter or the receiver antenna. Additionally, it would be desirable for a transceiver module to be coupled near each antenna element of an array to minimize noise figure in receiver applications and to maximize output power in transmitter applications. Further, it would be desirable that a transceiver module be an integrated circuit so as to eliminate the need for separate module blocks; decreasing the part count and improving yield and reliability because transceivers with high part counts complicate the manufacturing process and usually lead to a low mean time to failure and rework.

Thus, there is a need for a transceiver circuit that is suitable for transmitting and receiving applications that has flexibility to change topology based on a user input so as to meet changing system specification requirements, which the transceiver circuit further allows a user to optimize design criteria for low noise operation for receiver applications, and high power performance for transmitter applications and provides other advantages over present transceivers such as compactness and close proximity to the antenna elements.

BRIEF SUMMARY OF THE INVENTION

The present invention relates to an electronically programmable, multimode circuit for electronic systems that allows a user to electronically program and to reprogram electronic hardware components so that the same multimode circuit may be used for receiver and transmitter applications.

Specifically, an electronically programmable circuit comprises a first port and a second port. A first path is coupled between a first path port and said second port and the first path includes a first phase shift device coupled to a first FET gate array. A second path is coupled between a second path port and the second port where the second path includes a second phase shift device coupled to a second FET gate array. A phase shift coupler is coupled to the first port, the first path port, and the second path port. The first and second FET gate arrays and the first and second phase shift devices are electronically programmable and re-programmable by a user to select at least one mode.

It is an additional feature of the present invention that a phase shift coupler resolves a signal from the first port into a first vector component and a second vector component that are in phase quadrature, wherein the first vector component couples to the first path port and the second vector component couples to the second path port. An electronically programmable multimode circuit may be cascaded with at least one other electronically programmable multimode circuit to form an electronic module having at least one of the modes consisting of a multiplier, a mixer, an attenuator, a phase shifter, and an In-Phase and Quadrature (IQ) modulator.

It is another feature of the present invention that the first phase shift device may be a first Lange Coupler and the second phase shift device may be a second Lange Coupler. Further, each of the first and second plurality of FET gate arrays are dualgate FET arrays. Each dualgate FET of the array includes a first gate terminal, a second gate terminal, a source terminal, and a drain terminal.

It is another feature of the present invention wherein said first FET gate array comprises a first plurality of dual gate FETs and said second FET gate array comprises a second plurality of dualgate FETs. Each dualgate FET of the first array of dual gate FETs and the second array of dualgate FETs includes a first gate terminal, a second gate terminal, a source terminal, and a drain terminal. In one option of this feature, the first array of dualgate FETs has a plurality of the first gate terminals electrically connected together, a plurality of the second drain terminals electrically connected together, and a plurality of the source terminals electrically connected together. In this feature, the dualgate FET is electronically programmable and re-programmable by a separate electronic control signal coupled with each of the second gate terminal to turns-on or to turns-off dualgate current flow providing signal adjustment. In another instance, the dualgate FET is electronically programmable and re-programmable to a mixer mode wherein a local oscillator signal is coupled to each said second gate terminal. In yet another instance, the electronically programmable and re-programmable electronic circuit may be electronically controlled by at least one digital word input.

It is another feature that a first path and a second path may be electronically programmed and reprogrammed to optimize desired system performance. For instance, a first path and/or a second path requiring high power performance may be electronically programmed with optimized input and output matching networks, interstage impedance matching networks, and bias networks for high power amplification. In one instance, a first path and/or second path requiring low noise performance may be electronically programmed to achieve with optimized input and output matching networks, interstage impedance matching networks and bias networks for low noise amplification.

In another embodiment, a reconfigurable phased array system comprises at least one radiating element, at least one electronically programmable multimode Monolithic Microwave Integrated Circuit (MMIC). In this embodiment, the electronically programmable multimode MMIC comprises a first port and a second port and a first path coupled between the first path port and the second port. The first path includes a first phase shift device coupled to a first FET gate array. Further, a second path is coupled between a second path port and the second port, the second path including a second phase shift device coupled to a second FET gate array. Further the first and second FET gate array are FET dualgate arrays whereby each dualgate FET of the array includes a first gate terminal, a second gate terminal, a source terminal, and a drain terminal.

In instance, the first FET gate array may comprise a plurality of dualgate FETs and the second FET gate array may comprise a plurality of dualgate FETs. In another alternative, at least one of the plurality of dualgate FETs is electronically programmable and re-programmable to a mixer mode wherein a local oscillator signal is coupled to each said second gate terminal. The first and second FET dualgate arrays and the first and second phase shift device are electronically programmable and re-programmable by a user to choose at least one mode. Each of the second port of the at least one electronically programmable circuit is electrically coupled to said at least one radiating element. Further, a user programs and re-programs the phase angle and the amplitude of the antenna beam to point at discrete points along a constellation map so as to reposition the signal beam or to modify the signal beam shape and side lobe levels.

It is an advantage of the present invention that system requirements may be modified after the transceiver hardware is implemented, and the same transceiver hardware may be reprogrammed to change the transceiver module performance characteristics such as gain, phase shift, add and/or remove electronic hardware such as mixers, phase shifters, attenuators, and amplifiers.

It is another feature of the present invention that the programmable electronic circuit may synthesize angles within a 360-degree window with very fine resolution and provide gain control instead of loss. For example, when programming three dualgate FETs of the first and the second FET gate array within respectively a first and a second functional blocks as variable periphery amplifiers (VPAs), it is possible to achieve 11.5 degree antenna beams pointing accuracy. Further, the fine resolution and gain control provides a better means to focus the antenna beam width and increase the antenna pointing accuracy for target acquisition and tracking.

It is another advantage that the present invention may be electronically programmable as a phase shifter within a compact real estate area at low frequencies compared with convention delay-line phase shift approaches. Additionally, the compactness of the multimode transceiver circuits permits the transceiver circuits to be coupled near each antenna element of an array, which location minimizes noise figure for receiver applications and maximizes output power for transmitter applications. Another advantage is that the entire transceiver circuit would be integrated into one circuit. The one circuit approach eliminates the need for separate functional blocks, ultimately decreasing the part count and improving yield and reliability because amplifiers with high part counts complicate the manufacturing process and usually lead to a low mean time to failure and rework. The one circuit approach would be ideal for wireless data transmission and acquisition such wireless cell phones.

DESCRIPTION OF DRAWINGS

For a better understanding of the present invention, reference is made to the below-referenced accompanying drawings. Reference numbers refer to the same or equivalent parts of the present invention throughout the several figures of the drawings.

FIG. 2A is a diagram showing the phase states for the electronically programmable multimode circuit programmed for a phase shifter mode in accordance with the present invention.

DETAILED DESCRIPTION OF THE INVENTION

Figure 1:
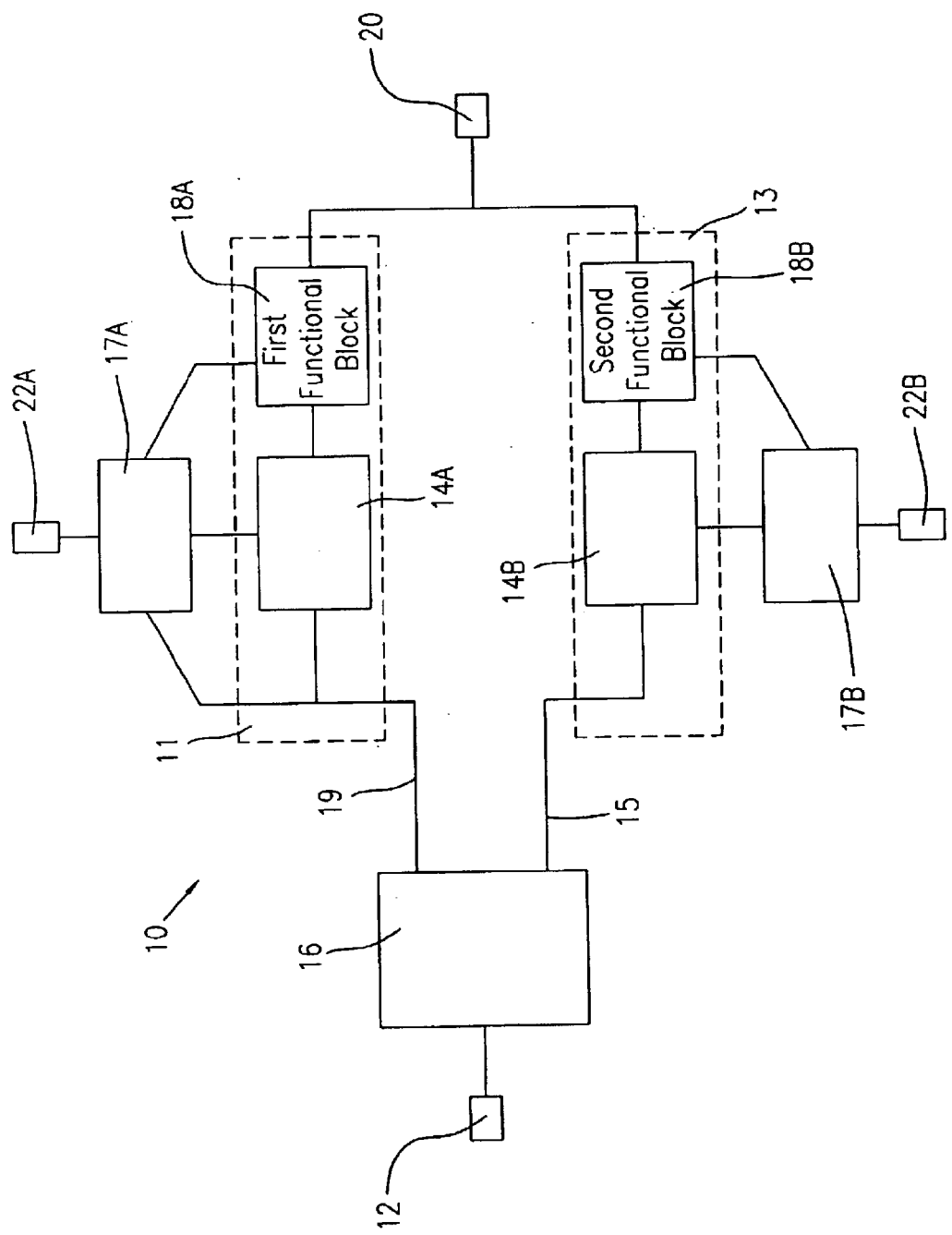
FIG. 1 is a block diagram of an electronically programmable multimode circuit in accordance with the present invention.

Referring particularly to FIG. 1, a block diagram of an electronically programmable multimode circuit 10 of the present invention is shown, which electronically programmable multimode circuit 10 may be programmed or re-programmed for at least one mode to perform various operations on a signal. Further, electronically programmable multimode circuit 10 includes a first path 11 and a second path 13. For purposes of describing the present invention, said electronically programmable multimode circuit 10 is described for transmitter and receiver applications. Further, it shall be noted that the present invention may be used for applications other than transmitter and receiver applications.

The electronically programmable multimode circuit 10 comprises a first port 12, a second port 20, electrodes 22A, 22B, control circuits 17A, 17B, a phase shift coupler 16, a first phase shift device 14A, a second phase shift device 14B, a first functional block 18A, and a second functional block 18B. The first path 11 is coupled between a first path port 19 and the second port 20. The first path 11 includes first phase shift device 14A coupled to the first functional block 18A. In the preferred embodiment, the first functional block 18A is a first FET gate array programmed to be either a first Variable Periphery Amplifier (VPA) device, or a first signal mixing device. In this example, the VPA is a programmable gain amplifier consisting of a plurality of FETS. The second path 13 is coupled between a second path port and the second port 20. The second path 13 including a second phase shift device 14B is coupled to the second functional block 18B. In the preferred embodiment, the second functional block 18B is a second FET gate array.

The phase shift coupler 16 couples to the first port 12, the first path port 13, and the second path port 15. In the preferred embodiment, the first and second FET gate arrays and said first and second phase shift devices are electronically programmable and re-programmable by a user to select at least one mode. Electrodes 22A, 22B are used to program the multimode circuit 10 for at least one mode to perform various operations on the signal. The signal is an electrical signal such as a Radio Frequency (RF), a Microwave or a Millimeter wave signal. In the preferred embodiment, electrodes 22A, 22B receive control input commands, such as a digital word input or alternatively analog voltage or current inputs, that will select at least one mode from a group consisting of a multiplier mode, a mixer mode, an attenuator mode, a phase shifter mode, and an In-Phase and Quadrature (IQ) modulator mode. The control input commands may be controlled by a user, hardwired, or preprogramed.

The control circuits 17A, 17B provide logic circuitry that will translate the control input commands into the required electronic input values for controlling the first phase shift device 14A, the second phase shift device 14B, and the first and the second functional blocks 18A, 18B. In one instance, the control circuits 17A, 17B may be bias networks such as resistive divider circuits. For example, electrodes 22A, 22B receive control input commands, such as TTL logic values, the control circuits 17A, 17B will translate the control input commands into the required bias inputs for the first phase shift device 14A, the second phase shift device 14B, the first functional block 18A, and the second functional block 18B. Further, the control circuits 17A, 17B may convert the control input commands, such as TTL logic, into bias values optimized for high-power transmitter applications or alternatively, for low noise receiver applications.

For many transmitter applications, a signal coupled from the first port 12 is resolved from the first port 12 into a first vector component 19 and a second vector component 15 that are in phase quadrature. The first vector component 19 couples to the first path port 13 from the phase shift coupler 16. Afterwards, the first vector component 19 is shifted in phase by the first phase shift device 14A, amplified by a first functional block 18A, and coupled to the second port 20. The second vector component 15 couples to the second path port 15 from the phase shift coupler 16. Afterwards, the second vector component 15 is phase shifted by the second phase shift device 14B, amplified by a second functional block 18B, and coupled to the second port 20.

For many receiver applications, a signal received at the second port 20 is input to the first functional block 18A and the second functional block 18B. The block 18A couples the signal through the first phase shift device 14A. The block 18B couples the signal through the second phase shift device 14B. Afterwards, the first vector component 19 and the second vector component 15 are recombined and phase shifted by a phase shift coupler 16 to produce a processed received signal at the first port 12.

The control logic values of electrodes 22A, 22B, determine if the circuit 10 is activated for the receiver applications or the transmitter applications and what modes are activated of the electronically programmable multimode circuit 10. Finally, the electronically programmable multimode circuit 10 may be cascaded with at least one other electronically programmable multimode circuit 10 to achieve greater functionality. Further, each electronically programmable multimode circuit 10 is programmable to at least one mode consisting of a multiplier mode, a mixer mode, an attenuator mode, a phase shifter mode, and an In-Phase and Quadrature (IQ) Modulator.

Figure 2:
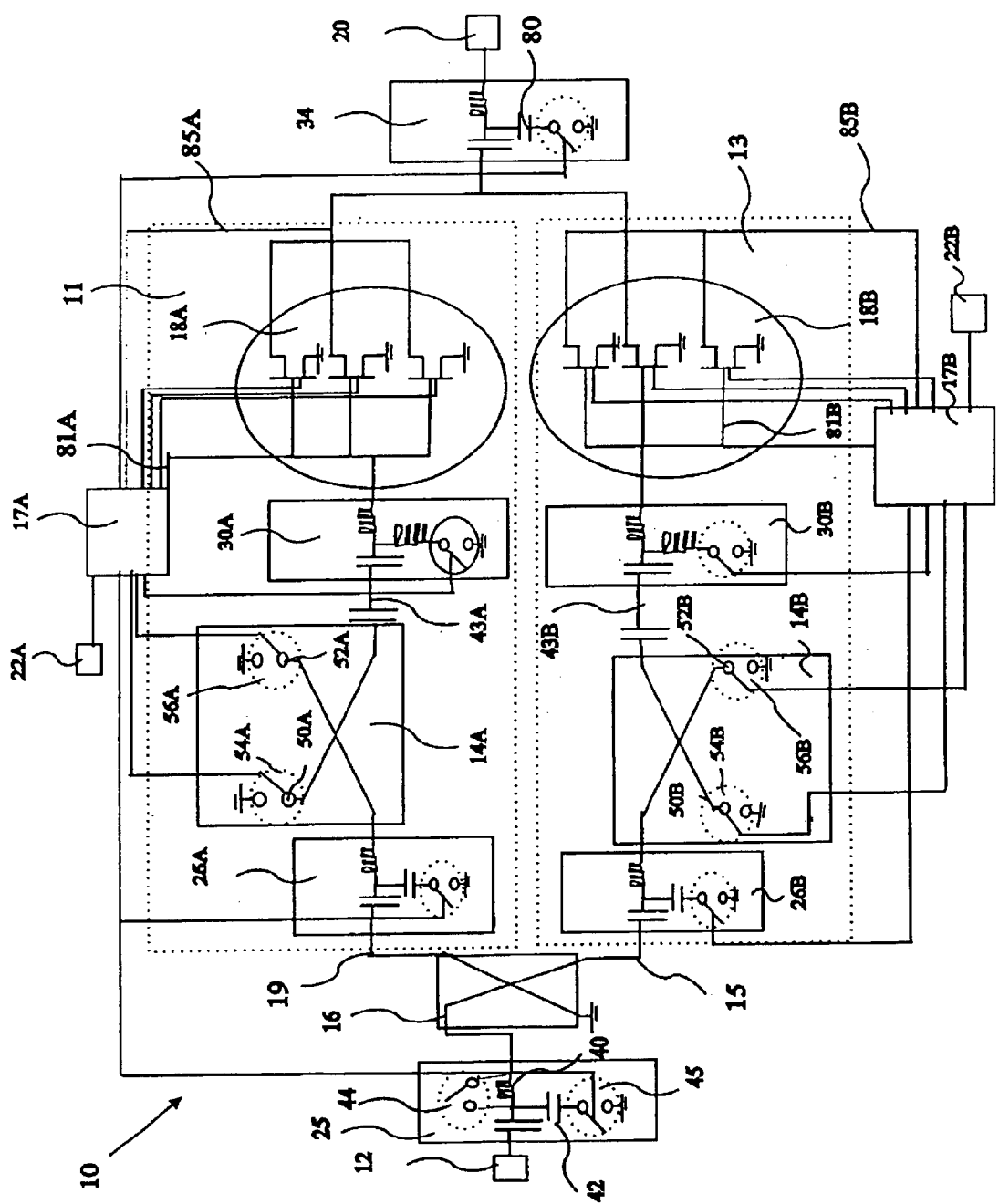
FIG. 2 is a schematic diagram of an electronically programmable multimode circuit in accordance with the present invention.

Referring particularly to FIG. 2 is a schematic diagram of an electronically programmable multimode circuit in accordance with the present invention. Electronically programmable multimode circuit 10 is suitable for use in a transceiver module coupled with a phased array antenna. Electronically programmable multimode circuit 10 comprises a first port 12, a second port 20, a first port matching network 25, electrodes 22A, 22B, control circuits 17A, 17B, a phase shift coupler 16, a first path 11, a second path 13, and a second port matching network 34. First port 12 serves a dual function, namely the first port 12 functions as a transmitter input port and a receiver output port. Second port 20 serves a dual function, namely the second port 20 functions as a receiver input port and a transmitter output port.

First path 11 comprises interstage matching networks 26A, 30A, a phase shift device 14A, and a first functional block 18A. Similarly, a second path 13 comprises interstage matching networks 26B, 30B, a phase shift device 14B, and a second functional block 18B. In this example, a signal is input into the first port 12 and is coupled through first port matching network 25 where the inductor 40 and the capacitor 42 are switched into/out by the control circuit 17A switching on/off the FETs 44, 45. In this instance, the first port matching network 25 is optimized to maximize output power. The signal output from the first port matching network 25 is transferred to a phase shift coupler 16. The phase shift coupler 16 may be any active or passive device that resolves the signal from first port matching network 25 into a first vector component and a second vector component and maintains phase quadrature before transferring the vector components to the interstage matching networks 26A, 26B. Specifically, the phase shift coupler 16 may be any 90 degrees or 180 degree active or a passive power divider network. As shown in this instance, the phase shift coupler is a Lange Coupler which splits the first port matching network 25 output signal into two vector components where the first vector component is input to interstage matching network 26A and the second vector component is input to interstage matching network 26B.

A phase shift device 14A in first path 11 and a phase shift device 14B in the second path 13 adjust the relative phase shift between signals in the first path 11 and the second path 13. The phase shift devices 14A, 14B are any devices that can implement an electronically programmable phase shift. The phase shift devices 14A, 14B may include phase shift elements such discrete components, e.g., inductors, capacitors, or other lumped elements and distributed elements, e.g., transmission delay lines. In this instance, it is preferred that the phase shift device 14A is a Lange Coupler having port 50A connected through a switch 54A to ground and port 52A attached through a switch 56A to ground. Switches 54A, 56A are controlled by control circuit 17A and programmable by control input commands from electrode 22A. Further in this instance, it is preferred that the phase shift device 14B is a Lange Coupler having port 50B connected through a switch 54B to ground and port 52B attached through a switch 56B to ground. Switches 54B, 56B are controlled by control circuit 17B and programmable by control input commands from electrode 22B. In this instance, the signal in the first path 11 and the signal in the second path 13 maintain phase quadrature, but the first vector component 19 and the second vector component 15 are repositionable to realize phase quadrature vector components between 0 and 360 degrees by varying the positions of the switches 54A, 56A, 54B, 56B shown in FIG. 2.

FIG. 2A is a diagram showing the phase states for the electronically programmable multimode circuit 10 programmed for a phase shifter mode in accordance with the present invention. Each of the switches 54A, 56A, 54B, and 56B map the first vector component 15 and the second vector component 19 into four distinct phase quadrants. As shown in FIGS. 2 and 2A, if the switches 54A, 56A, 54B, 56B are open-circuited, i.e., in the off-position, the first vector component 19 and the second vector component 15 are shifted 0-degrees, thereby, the first path output port 43A signal and the second path output port 43B signal remain in the first quadrant 31. Alternatively, if switches 54A, 56A are in the on-position and 56B, 56B are open-circuited, the first vector component 19 is shifted 180-degrees and the second vector component 15 is shifted 0-degrees, thereby, the first path output port 43A signal and the second path output port 43B signal are phase shifted to the second quadrant 33. Alternatively, if the switches 54A, 56A are short-circuited, i.e., connected to ground, and the switches 54B, 56B are short-circuited, the first vector component 19 is shifted 180-degrees and the second vector component 15 is shifted 180-degrees, thereby, the first path output port 43A signal and the second path output port 43B signal are phase shifted to the third quadrant 37. Further, if the switches 54A, 56A are open-circuited and switches 54B, 56B are short-circuited, i.e., connected to ground, the first vector component 19 is shifted 0-degrees and the second vector component 15 is shifted 180-degrees, thereby, the first path output port 43A signal and the second path output port 43B signal are phase shifted to the fourth quadrant 39. The choices of phase shifter devices, phase angles, transistors, or phase shift coupler are only exemplary in nature.

Figure 3:
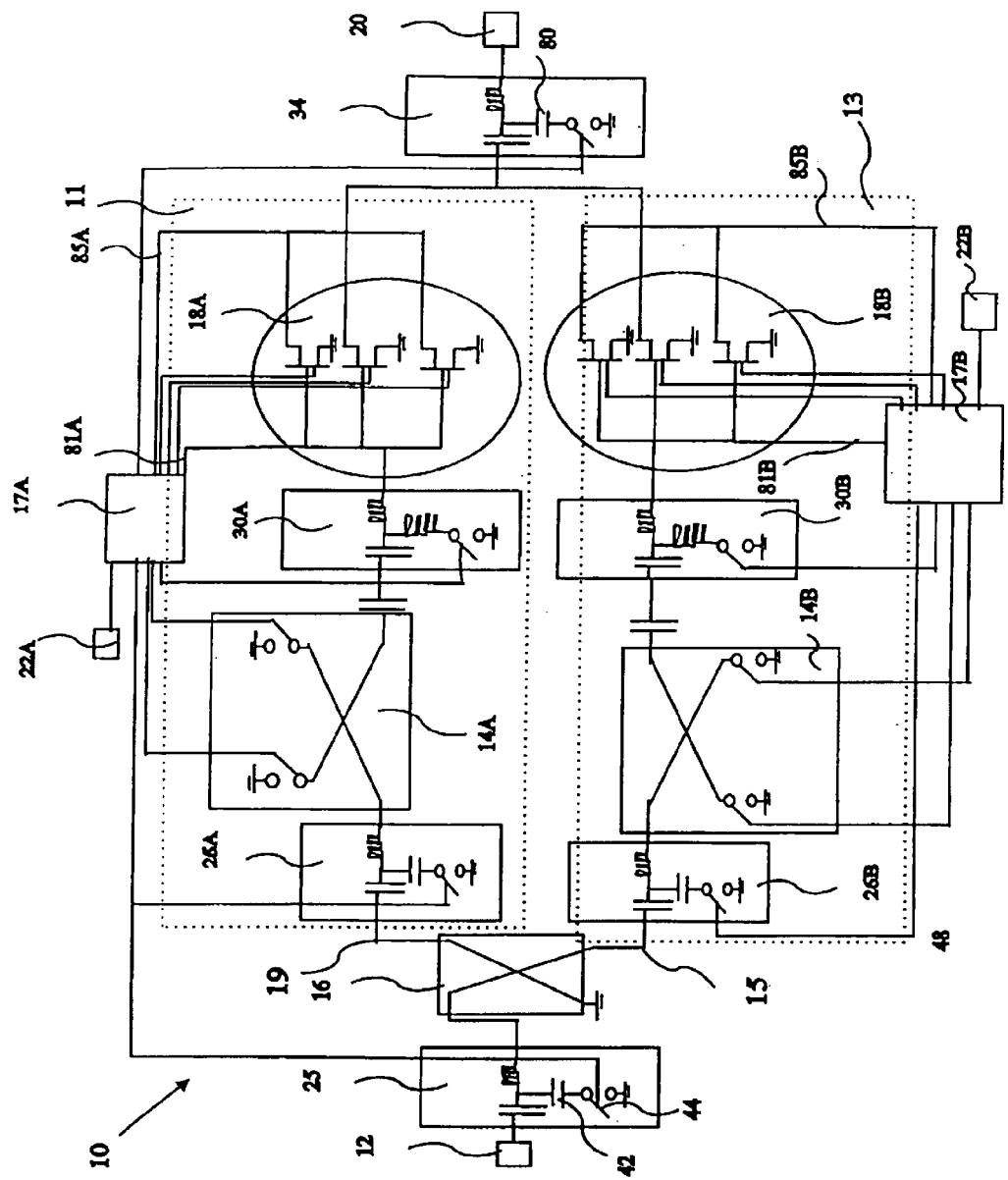
FIG. 3 is a schematic diagram showing the electronically programmable multimode circuit programmed for an IQ modulation mode in accordance with the present invention.

FIG. 3 is a schematic diagram showing the electronically programmable multimode circuit 10 programmed for an IQ modulation mode in accordance with the present invention. As shown, the phase shifter mode may be combined with the first functional block 18A and the second functional block 18B to realize more electronic programmability capability; thereby, the multimode circuit will produce an IQ modulation mode. In the preferred embodiment, the functional blocks 18A, 18B are a plurality of first and second gate array of FET dualgate array electronically programmed as a one-stage dualgate FET amplifier. First functional block input matching networks 30A, 30B may be high pass, low pass, or band pass with control circuits 17A, 17B allowing electronic programming to choose the desired first and second functional block network elements. Each dualgate FET of the array has at least one first gate terminal, at least one second gate terminal, at least one drain terminal, and a source terminal.

In the alternative, it should be noted that the first functional blocks 18A, 18B may also include the addition of matching networks and have multiple stages of dualgate FET stages. In another alternative, it should be noted that other active devices may be substituted for the dualgate FETs such as Bipolar Junction Transistors (BJT), High Electron Mobility Transistors (HEMT), Complementary Metal Oxide Semiconductor (CMOS) devices, or generally other active devices having current gain and/or voltage gain. Matching networks 30A, 30B, and 34 respectively may be implemented as low pass, bandpass, or high pass networks. In the one embodiment, the electronically programmable multimode circuit 10 is a Variable Periphery Amplifier (VPA) wherein the first and second FET gate arrays comprise three dualgate FETs, which the three dualgate FETs have the first gate terminals electrically connected together, the drain terminals electrically connected together, and the source terminals electrically connected together.

Additionally, in the preferred embodiment, the dualgate FETs are electronically programmable and re-programmable by a separate electronic control signal coupled with each said second gate terminal to turn-on (i.e., activated) or to turn-off (i.e., deactivated) one or more than one dualgate FET current flow to provide signal amplitude adjustment. As such for commercial applications such as cell phones or wireless Personal Digital Assistants (PDAs), parallel stages of the dualgate FET array may be turned-off to save dc power and extend system power. Further, more parallel stages of the dualgate FET array may be activated and placed in the signal path to increase signal gain; thereby providing the multimode circuit 10 an electronically variable amplitude adjustment mechanism so as to be able to steer the I and Q vector components with 360-degrees, thereby providing for a user or a satellite system an IQ mapping constellation mode so that multiple pointing vectors may be programmed and reprogrammed. The number of parallel stages of dual gate FET devices used in each VPA that are activated determines the step size of the bits and consequently the bit resolution of the phase shift within the quadrant. For instance, with three equal periphery devices per VPA, one can synthesize phase within a single quadrant at 11.25 degree resolutions. Thus, the phase shifter mode is capable of generating any phase within 360 degrees at predetermined intervals. Further, the VPA may be used alone to produce an amplifier mode. Further, it should be noted that the number, the periphery size of each device in the VPA, and the power density capacity of each device used in each VPA may be varied, i.e., increased or decreased to vary the synthesized phase angle within a single quadrant, thereby allowing a user to change the phase resolution within a given quadrant.

The dualgate FETs of the array may be self-biased using a resistive voltage divider network (not shown in a diagram). If the dualgate FET is a depletion mode HEMT power process device to maximize transmitter output power, gate ports 81A, 81B are biased near zero volts and drain ports 85A, 85B are biased such that the output voltage swing does not result in the gate to drain voltage exceeding breakdown conditions. The dualgate FET may be a common source amplifier with a grounded source terminal. In the alternative, a single gate FET or a BJT active device may replace the dualgate FET with a grounded emitter terminal. Typically, the output matching network of the VPA will be a low impedance series transmission line or a low impedance shunt capacitance or an open circuit transmission line stub. In FIG. 2, a low impedance shunt capacitor 80 is utilized to transform the low output impedance of the power amplifier to a higher, more easily manageable impedance. In addition, to achieve maximum output power transmitter amplifier output matching network 34 accounts for the off-state capacitances of shut-off dualgate FET reactances, resistances, and parasitic components, i.e., off-state capacitance, series inductance, or parasitic resistance. The particular advantage of this electronically programmable topology is that the function blocks 18A, 18B may be tuned for maximum output power transfer or maximum noise performance. Further, to control the impedance variation between phase states, the on/off state of the device is controlled using the second gate so that the first gate can be constantly biased to maintain Capacitance from Gate-to-Source (CGS) of the dualgate FET and minimize input impedance variation.

Figure 4:
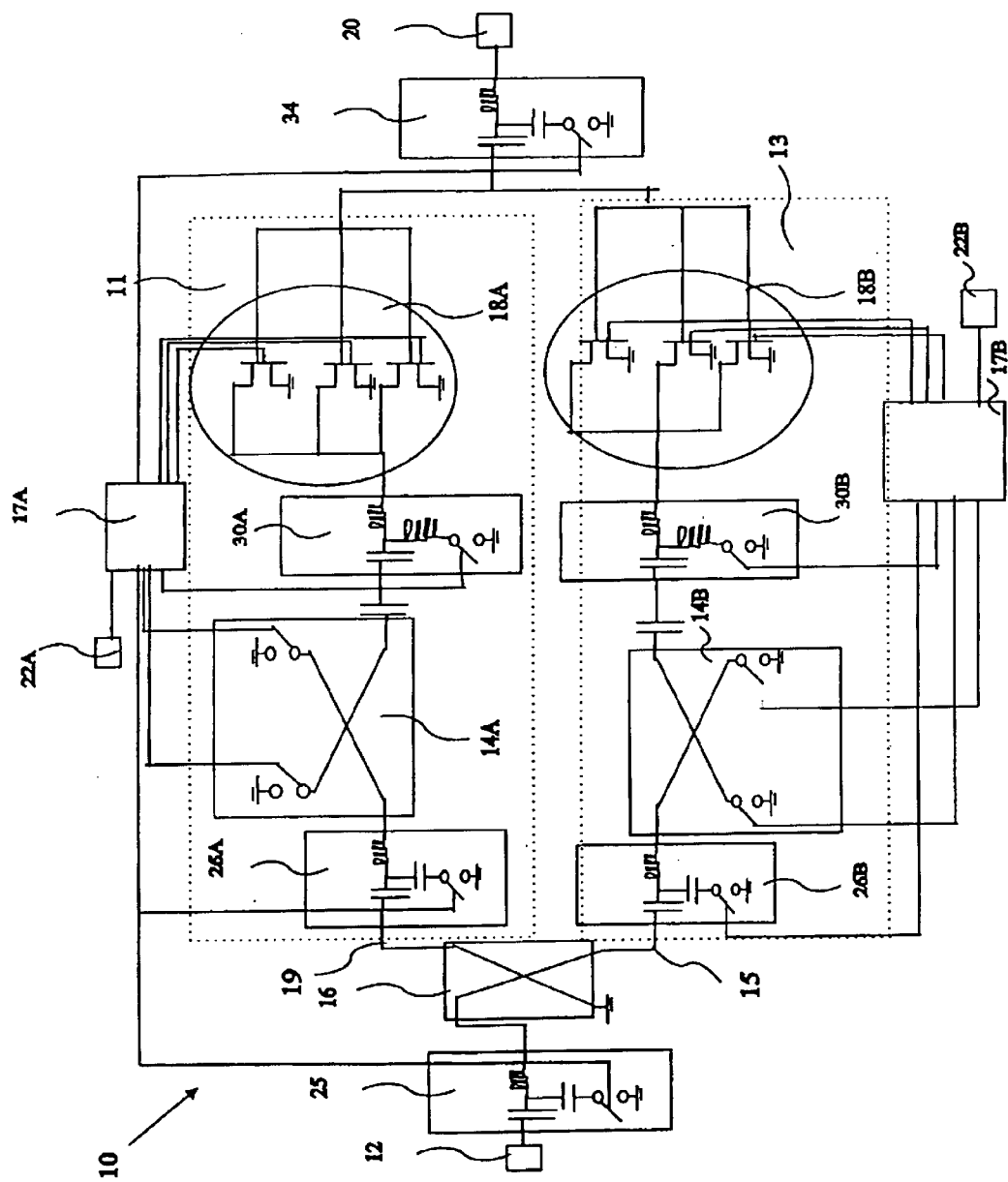
FIG. 4 is a schematic diagram showing the electronically programmable multimode circuit programmed for receiver applications in accordance with the present invention.

FIG. 4 is a schematic diagram showing the electronically programmable multimode circuit 10 programmed for receiver applications in accordance with the present invention. As shown in FIG. 4, the electronically programmable multimode circuit is programmed for a receiver application where the Variable Periphery Amplifier (VPA) receives an incoming signal from the second port 20 with matching network 34 tuned for an optimal input noise figure. Afterwards, the phase shift devices 14A and 14B adjust the phase of the incoming signal before it is combined in the phase shift coupler 16 and output to the first port 12. See FIG. 2 above for discussion of electronic programming features.

Figure 5:
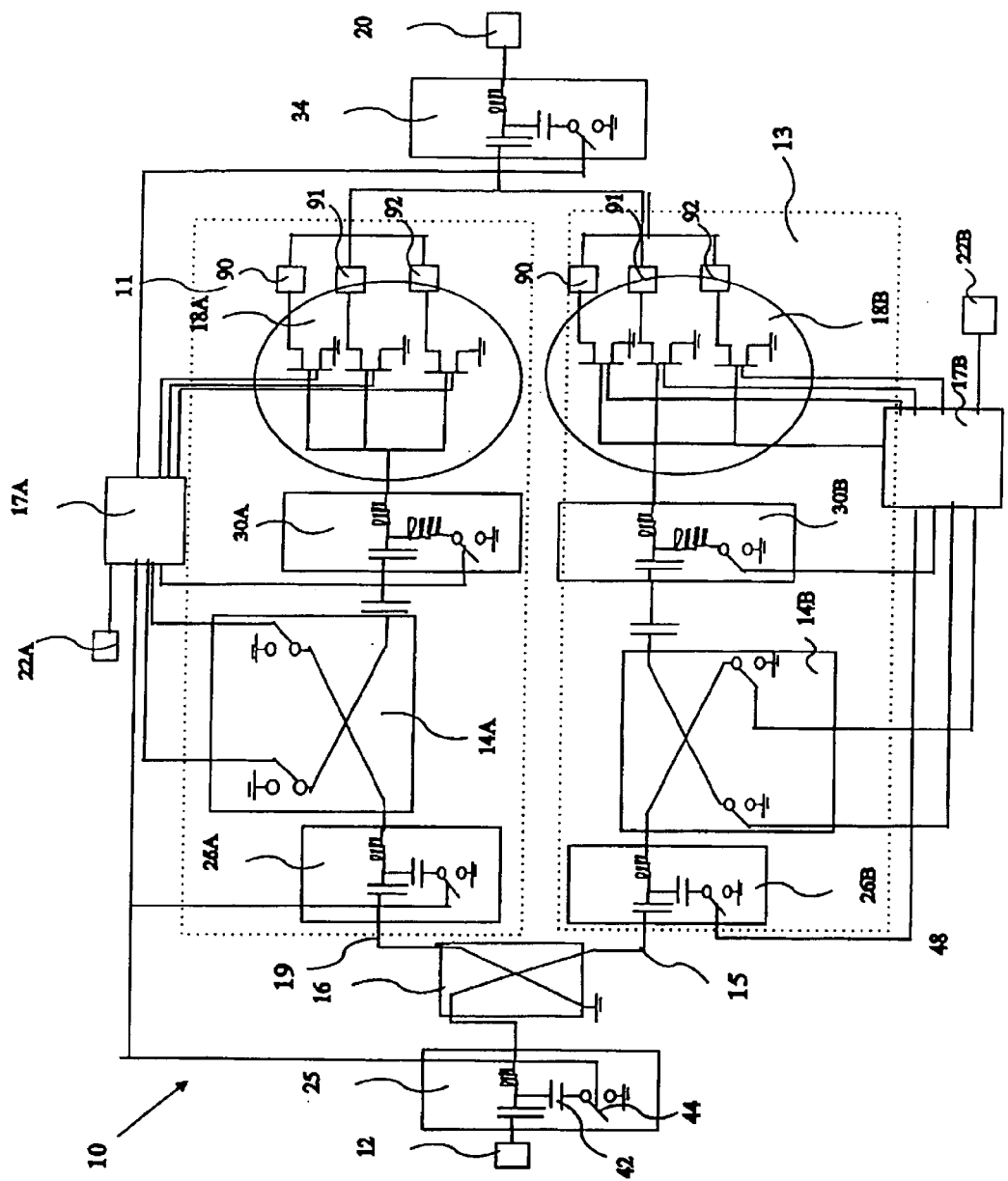
FIG. 5 shows a schematic diagram of an electronically programmable multimode circuit programmed to produce a switched attenuator mode in accordance with the present invention.

FIG. 5 shows a schematic diagram of an electronically programmable multimode circuit 10 programmed to produce an attenuator mode in accordance with the present invention. The Variable Periphery Amplifier (VPA) may be used to produce an attenuator mode. In one instance, an attenuator mode may be realized by turning-down the bias of the VPA so that the second port 20 signal level is 3 dB down from the first port 12 signal level. In another instance, resistive pi-pads or tee networks may be switched into the signal paths 11 and 13 to attenuate the signal arriving at port 20 from the first signal path 11 and the second signal path 13. As shown in FIG. 5, a one dB attenuator 90, a two attenuator dB 91, and three dB attenuator 92 may be switched into the signal paths 11 and 13 to vary the signal level attenuation.

Figure 6:
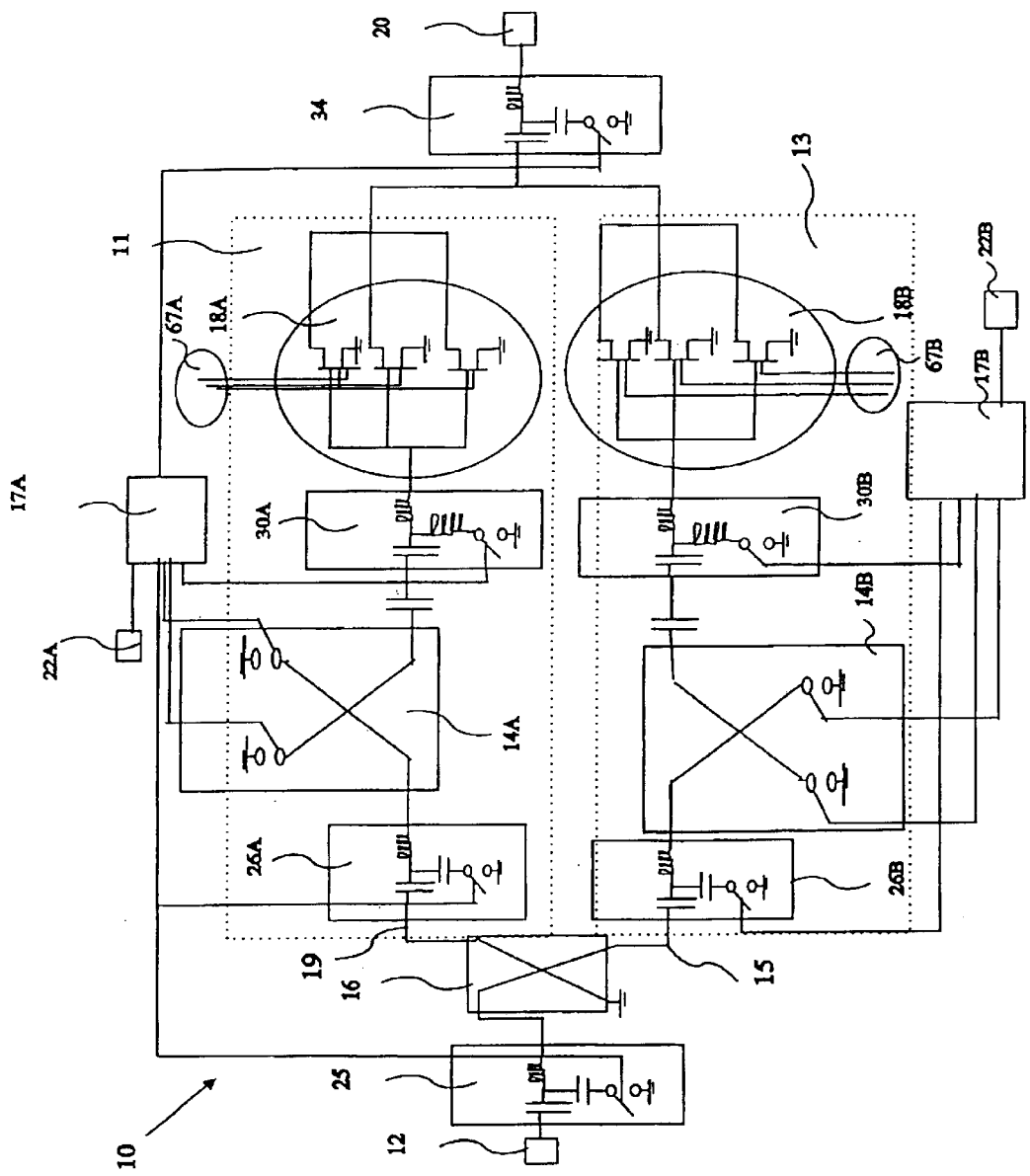
FIG. 6 is a schematic diagram of an electronically programmable multimode circuit programmed for a mixer mode or a multiplier mode in accordance with the present invention.

FIG. 6 shows a schematic diagram of an electronically programmable multimode circuit 10 programmed to produce a mixer mode or a multiplier mode in accordance with the present invention. As shown, each said dualgate FET of the multimode electronically programmable circuit 10 is electronically programmable and re-programmable to a mixer mode wherein a local oscillator signals 67A, 67B are coupled to each said second gate terminal. As such, the first and the second functional blocks 18A, 18B produce at second port 20 a frequency-shifted version of a signal input at the first port 12. The basics of a dualgate mixer design are well known in the art and are explained in the book titled "Microwave Mixers" by author Stephen Maas. In the alternative, each said dualgate FET of the multimode electronically programmable circuit 10 is electronically programmable and re-programmable to a multiplier mode wherein a frequency signal source 67A, 67B is coupled to each said second gate terminal. As such, this circuit at second port 20 will create power at an harmonic frequency of the signal from the first port 12 and a local oscillator (LO) frequency source coupled to each second gate terminal 67A, 67B. In the alternative, the phase shift devices 14A and 14B may be used to adjust the phase between the first vector component and the second vector component so that when the signals from first path 11 and second path 13 are summed at the second port 20, power at a multiple of the frequency of the first vector component 19 and the second vector component 15 produced at the second port 20.

Figure 7A:
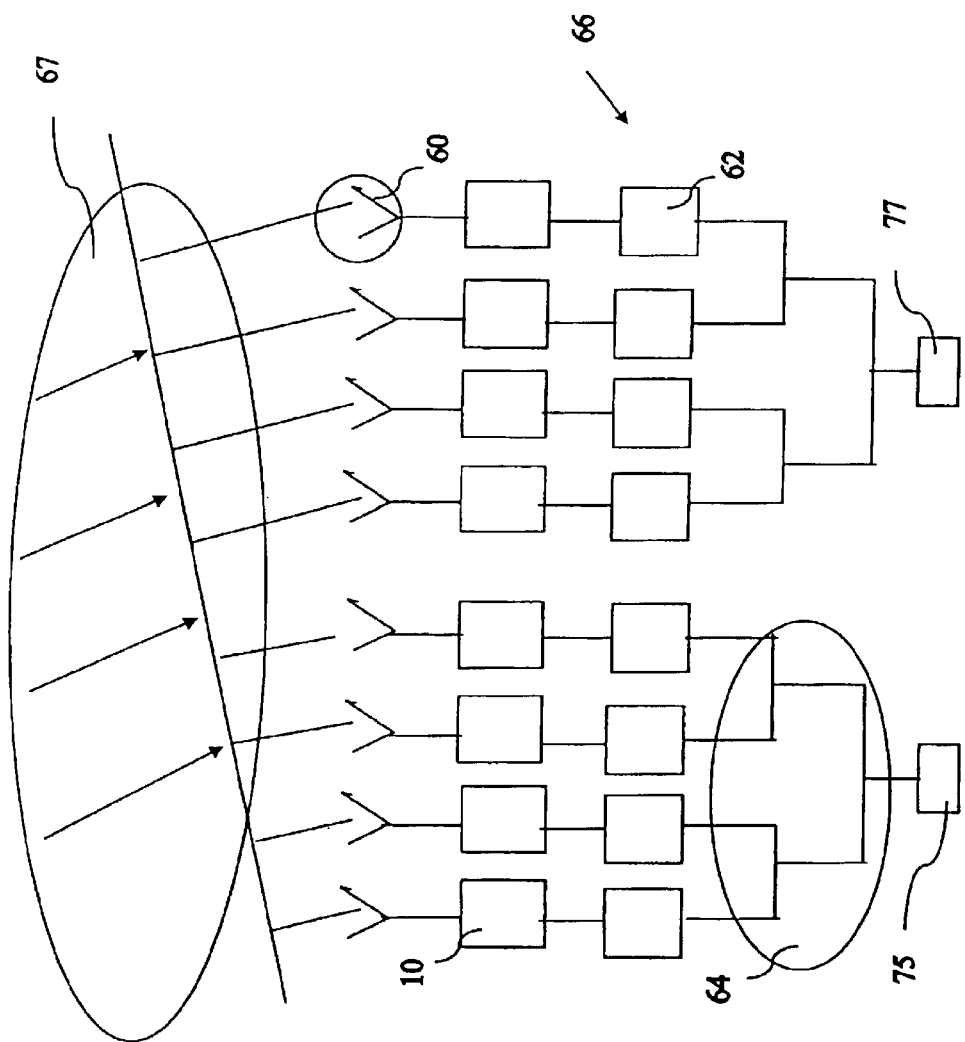
FIG. 7A is a schematic diagram of an electronically programmable multimode circuit used as part of a linear phased array for receiver applications in accordance with the present invention.

Referring particularly to FIG. 7A, a schematic diagram of the electronically programmable multimode circuit 10 is shown as part of a phased array 66. A linear phased array allows the user to control the beam shape and side lobe levels for a radiated antenna pattern by electronically controlling the phase and the amplitude of each of its radiating elements 60. In this implementation, incoming signal wavefront 67 is received by each radiating element 60 of phased array 66. Each element 60 is electrically coupled to one electronically programmable multimode circuit 10. For instance, a radiating element 60 may be a microstrip patch or a horn antenna. In this receive application, each electronically programmable multimode circuit 10 provides low noise signal amplification directly at each radiating element 60.

Thus, by having the electronically programmable multimode circuit 10 with a low noise figure and amplitude gain, to overcome losses between radiating element 60 and electronically programmable multimode circuit 10 and in any adjoining combining matrix 64 electrically coupled to radiating element 60, the received input signal to noise performance is minimally degraded, thereby allowing faint received signals to be recovered. In addition, because each radiating element 60 is coupled to electronically programmable multimode circuit 10, the amplitude excitation of each radiating element 60 may be individually controlled to control the phased array beam shape and side lobe level. Optionally, a combining matrix 64 having matrix output ports 75, 77 may be utilized.

Figure 7B:
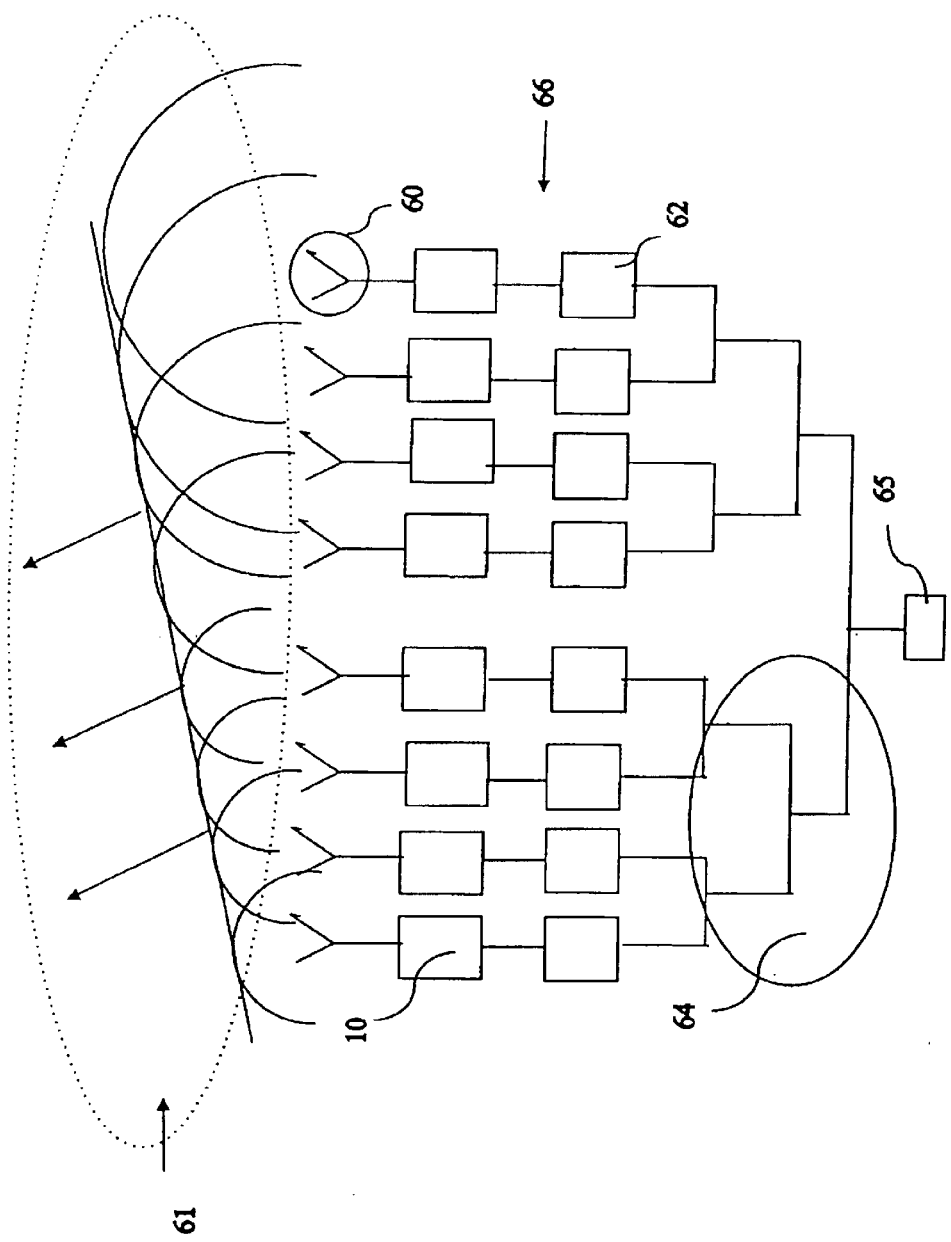
FIG. 7B is a schematic diagram of an electronically programmable multimode circuit used as part of a linear phased array for transmitter applications in accordance with the present invention.

Referring to FIG. 7B, electronically programmable multimode circuit 10 in the high power transmit mode allows the transmitted signal 65 to be boosted before being transmitted as an output signal wavefront 61. Further, fabricating the phased array 66 on a Monolithic Microwave Integrated Circuit (MMIC) semiconductor wafer including radiating elements 60 coupled to electronically programmable multimode circuit 10, produces a low cost phased array 66. Optionally, a combining matrix 64 having matrix port 65 may be utilized. Additionally, because electronically programmable multimode circuit 10 is after the combining matrix 64 where combining matrix 64 is lossy, a smaller periphery, i.e., smaller area active devices, electronically programmable multimode circuit 10 with lower dc power consumption may be utilized because electronically programmable multimode circuit 10 being proximal to radiating element 60 minimizes insertion loss.

As a result, an array 66 provides low noise performance while preserving long distance signal transmit capability with a smaller device periphery FET device amplifier. Further, because each electronically programmable multimode circuit 10 MMIC occupies about a 1.2 mm by a 1.2 mm area, a complete MMIC phased array 66 operating about 35 Gigahertz (GHz) may be produced with hundreds of microstrip patches and occupied only an approximately a 3 inch square area on a 4-mil thick semiconductor wafer. Thus, one of the many advantages of an MMIC phased array is a reduced size while achieving large aperture performance. Another advantage is that the phased array 66 containing hundreds of radiating elements 60 would be low cost because all of the basic transceiver modes, i.e., transmit and receive amplification, are achieved using one small MMIC amplifier.

Figure 8:
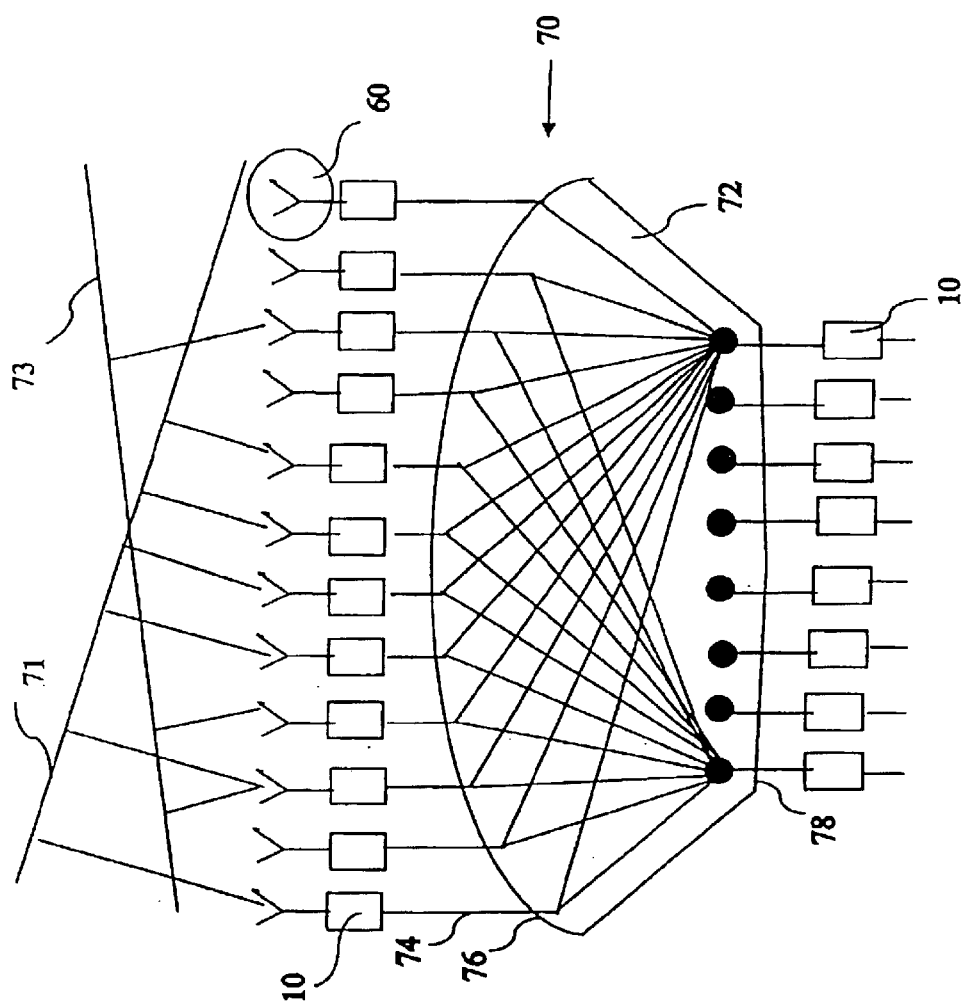
FIG. 8 is a schematic diagram of an electronically programmable multimode circuit used as part of a Rotman Bootlace Lens matrix array in accordance with the present invention.

Referring to FIG. 8, a schematic diagram of electronically programmable multimode circuit 10 used as part of a Rotman Bootlace Lens matrix array 70 is shown. Another method for transmitting and receiving RF energy to and from an array of radiating elements 60 is to use a lens such as Rotman Bootlace Lens 72. Rotman Lens 72 comprises an array port side 76 where the radiating elements are attached, and a beam port side 78 where electronically programmable multimode circuits 10 are attached. Lens 72 comprises a large flat plate center conductor sandwiched between two ground planes with individual waveguide-to-microstrip launches 74 where the tapered launches transition the impedance from beam port side 78 to array port side 76. If array 70 is in the receive mode, the incoming signal wavefronts 71, 73 intercepted on the array port side 76 one controlled by the angle subtended by the tapered sections of the connector launches much like a larger antenna. The main advantage of using Rotman Bootlace Lens 72 is to provide true time delay phase shift and amplitude tapering in one lens component where the true time delay and beam steering is independent of frequency. Additionally, the compactness of the multimode transceiver circuits permits the transceiver circuits to be coupled near each antenna element of an array, which location minimizes noise figure for receiver applications and maximizes output power for transmitter applications.

In another instance, the electronically programmable multimode circuit may be used for wireless data transmission and acquisition such as for cell phone or personal digital assistants (PDA) because the entire transceiver circuit with multiple functions would be integrated into one circuit. In this instance, the same electronically programmable multimode circuit may use the same antenna. This one circuit approach eliminates the need for separate functional blocks, ultimately decreasing the part count and improving yield and reliability because amplifiers with high part counts complicate the manufacturing process and usually lead to a low mean time to failure and rework.

Information as herein shown and described in detail is fully capable of attaining the above-described object of the invention, the present preferred embodiment of the invention, and is, thus, representative of the subject matter which is broadly contemplated by the present invention. The scope of the present invention fully encompasses other embodiments which may become obvious to those skilled in the art, and is to be limited, accordingly, by nothing other than the appended claims, wherein reference to an element in the singular is not intended to mean "one and only one" unless explicitly so stated, but rather "one or more." All structural and functional equivalents to the elements of the above-described preferred embodiment and additional embodiments that are known to those of ordinary skill in the art are hereby expressly incorporated by reference and are intended to be encompassed by the present claims.

Moreover, no requirement exists for a device or method to address each and every problem sought to be resolved by the present invention, for such to be encompassed by the present claims. Furthermore, no element, component, or method step in the present disclosure is intended to be dedicated to the public regardless of whether the element, component, or method step is explicitly recited in the claims. However, one skilled in the art should recognize that various changes and modifications in form and material details may be made without departing from the spirit and scope of the inventiveness as set forth in the appended claims. No claim herein is to be construed under the provisions of 35 U.S.C. § 112, sixth paragraph, unless the element is expressly recited using the phrase "means for."

What is claimed:

1. An electronically programmable multimode circuit comprising:
    a first port;
    a second port;
    a first path coupled between a first path port and said second port, said first path including a first phase shift device coupled to a first FET gate array;
    a second path coupled between a second path port and said second port, said second path including a second phase shift device coupled to a second FET gate array;
    a phase shift coupler coupled between said first port, said first path port, and said second path port; and
    said first and second FET gate arrays and said first and said second phase shift devices are electronically programmable and re-programmable by a user to select at least one mode.

2. An electronically programmable multimode circuit in accordance with claim 1, wherein said phase shift coupler resolves a signal from the first port into a first vector component and a second vector component which are in phase quadrature, wherein said first vector component couples to said first path port and said second vector component couples to said second path port.

3. An electronically programmable multimode circuit in accordance with claim 1, wherein said electronically programmable multimode circuit may be cascaded with at least one other electronically programmable multimode circuit to form an electronic module having a least one of a plurality of modes consisting of: a multiplier, a mixer, an attenuator, a phase shifter, and an In-Phase and Quadrature (IQ) modulator.

4. An electronically programmable multimode circuit in accordance with claim 1, wherein said first phase shift device is a first Lange Coupler and said second phase shift device is a second Lange Coupler.

5. An electronically programmable multimode circuit in accordance with claim 1, wherein each of said first and second FET gate arrays are dualgate FET arrays whereby each dualgate FET of the array includes a first gate terminal, a second gate terminal, a source terminal, and a drain terminal.

6. An electronically programmable multimode circuit in accordance with claim 5, wherein said first and second FET gate arrays comprise dualgate FETs, said dualgate FETs have said first gate terminals electrically connected together, said drain terminals electrically connected together, and said source terminals electrically connected together.

7. An electronically programmable multimode circuit in accordance with claim 5, wherein each said dualgate FET is electronically programmable and re-programmable by a separate electronic control signal coupled with each said second gate terminal to turn-on or to turn-off dualgate current flow providing signal adjustment.

8. An electronically programmable multimode circuit in accordance with claim 5, wherein each said dualgate FET is electronically programmable and re-programmable to a mixer mode wherein a local oscillator signal is coupled to each said second gate terminal.

9. An electronically programmable multimode circuit in accordance with claim 1, wherein said at least one mode is selected from a group consisting of a multiplier, a mixer, a switched attenuator, a phase shifter, and an In-Phase and Quadrature (IQ) modulator.

10. An electronically programmable multimode circuit in accordance with claim 1, wherein said electronic programmability and re-programmability is controlled by at least one input digital word.

11. A reconfigurable phased array system comprising:
at least one radiating element;
at least one electronically programmable Monolithic Microwave Integrated Circuits (MMICs);
wherein said electronically programmable MMIC comprises:
a first port;
a second port;
a first path coupled between a first path port and said second port, said first path including a first phase shift device coupled to a first FET dualgate array;
a second path coupled between a second path port and said second port, said second path including a second phase shift device coupled to a second FET dualgate array;
a phase shift coupler coupled to said first port, said first path port, and said second path port; and a phase shift coupler coupled to said first port, said first path port, and said second path port; and
said first and said second FET dualgate arrays and said first and said second phase shift device are electronically programmable and re-programmable by a user to choose one of a plurality of modes;
wherein each said at least one electronically programmable MMIC second port is electrically coupled to said at least one radiating element.

12. A reconfigurable phased array in accordance with claim 11, wherein said phase shift coupler resolves a signal from the first port into a first vector component and a second vector component that are in phase quadrature, wherein said first vector component couples to said first path port and said second vector component couples to said second path port.

13. A reconfigurable phased array in accordance with claim 11, wherein said at least one electronically programmable MMIC first port may be electrically connected with a second electronically programmable MMIC second port to form an electronic module whereby said electronic module is electronically programmable and re-programmable to at least one mode consisting of a multiplier, a mixer, an attenuator, a phase shifter, and an In-Phase and Quadrature (IQ) modulator.

14. A reconfigurable phased array system in accordance with claim 11, wherein said first phase shift device is a first Lange coupler and second phase shift device is a second Lange coupler.

15. A reconfigurable phased array system in accordance with claim 11, wherein said first and second plurality of dualgate FETs are three dualgate FETs.

16. A reconfigurable phased array system in accordance with claim 11, wherein said dualgate FETs are individually electronically programmed and re-programmed off and on to provide dc power savings.

17. A reconfigurable phased array system in accordance with claim 11, wherein said at least one mode is selected from a group consisting of a multiplier, a mixer, a switched attenuator, a phase shifter, and an In-Phase and Quadrature (IQ) modulator.

18. A transceiver circuit comprising:
a first electronically programmable multimode circuit for an In-Phase and Quadrature Phase (IQ) mode; said first circuit electrically connects first port to a second port;
a second electronically programmable multimode circuit for a mixer mode; said second circuit electrically connects said second port to a third port;
a third electronically programmable multimode circuit for a phase shifter mode; said third circuit electrically connects said third port to a fourth port;
each said first, said second, and said third electronically programmable multimode circuits including:
a plurality of modes;
a signal port;
a path port;
said plurality of modes consisting of a multiplier, a mixer, a phase shifter, an amplifier, an attenuator, and an IQ modulator mode;
a first path having an first path input port and a path port; said first path is electronically programmable and re-programmable controlling signal phase and amplitude adjustment;
a second path having an second signal input port and said path port; said second path is electronically programmable and re-programmable controlling signal phase and amplitude adjustment; and
a quadrature phase shift coupler electrically connecting said first path input port and said second path input port with said signal port.

19. A reconfigurable transceiver circuit in accordance with claim 18, further comprising a fourth electronically programmable multimode circuit for an amplifier mode; said fourth electronically programmable multimode circuit electrically connects said fourth port to a fifth port.

* * * * *